United States Patent
Johnson et al.

(10) Patent No.: US 6,828,825 B2
(45) Date of Patent: Dec. 7, 2004

(54) PULSE RESPONSE OF FAST LEVEL SHIFTER

(75) Inventors: Alan Michael Johnson, Richardson, TX (US); David Alexander Grant, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/228,635

(22) Filed: Aug. 27, 2002

(65) Prior Publication Data

US 2004/0041585 A1 Mar. 4, 2004

(51) Int. Cl.[7] .......................................... H03K 19/175
(52) U.S. Cl. ........................... 326/68; 326/80; 326/81
(58) Field of Search ............................ 326/68, 80, 81; 327/333

(56) References Cited

U.S. PATENT DOCUMENTS

| | | | |
|---|---|---|---|
| 4,450,371 A | * | 5/1984 | Bismarck .................... 307/475 |
| 4,980,583 A | * | 12/1990 | Dietz ........................ 307/475 |
| 5,539,334 A | | 7/1996 | Clapp, III et al. |
| 6,288,591 B1 | | 9/2001 | Riccio |
| 6,369,612 B1 | | 4/2002 | Shokouhi |

* cited by examiner

Primary Examiner—Anh Q. Tran
(74) Attorney, Agent, or Firm—W. Daniel Swayze, Jr.; W. James Brady; Frederick J. Telecky, Jr.

(57) ABSTRACT

Systems and methods are provided for detecting a state change of a level shifter and actively driving the level shifter into the new state to facilitate the recovery of the level shifter. The system and method also provide logic for setting up the level shifter for the next transition. A transition of a high logic to low logic of a first internal node and a second internal node is monitored. The first internal node and the second internal node transition between opposing logic levels, such that one internal node is pulled low and the other internal node is pulled high. The monitor determines when one node is pulled low and actively drives the other node to a logic high to facilitate the recovery of the level shifter.

8 Claims, 8 Drawing Sheets

PULSE RESPONSE OF FAST LEVEL SHIFTER

TECHNICAL FIELD

The present invention relates to electrical circuits and more particularly to direct current (DC) to direct current (DC) level shifters.

BACKGROUND OF INVENTION

Voltage level shifter circuits are used in applications where input logic voltage level signals are translated to output signals at higher voltage levels. For example, automotive, electronic data processing, and industrial control applications require high voltage level shifter circuits to drive various peripheral devices. Such circuits are often implemented in application specific integrated circuits (ASICs) or as independently packaged circuits. High voltage level shifter circuits translate a logic level (e.g., 0 to 5 volts) input signal to signals at high voltage levels. The level shifter typically includes a first pull-down transistor cross coupled to the gate of a first pull up transistor via a first node "A", and a second pull down transistor cross coupled to the gate of a second pull up transistor via a second node. As the data input transitions at the lower voltage level between high logic and low logic, the pull down transistors will transition between pulling one node to ground or logic low causing the other node to be pulled up to a logic high at the higher shifted voltage level. The higher shifted voltage level logic can then be provided as output, for example, through one or more driver circuits.

The design of a low voltage to high voltage level shifter usually involves striking a balance between the strength of pull down transistors and the cross-gate connected pull-up transistors. FIG. 1 illustrates a conventional level shifter device 10 for converting an input signal from a low voltage $V_2$ to a high voltage $V_1$. The level shifter device 10 includes a level shifting circuit 12. The level shifting circuit 12 includes a first p-type MOSFET device P1 with its drain coupled to the drain of a first n-type MOSFET device N1 through a node "A". A second p-type MOSFET device P2 has its drain coupled to the drain of a second n-type MOSFET device N2 through a node "B". The node "A" is coupled to the gate of the second p-type MOSFET device P2, and the node "B" is coupled to the gate of the first p-type MOSFET device P1. An input signal $V_{IN1}$ is received at the gate of the second n-type MOSFET device N2. The input signal is also received at the gate of the first n-type MOSFET device N1 through a first inverter 14. The node "B" provides a level shifted signal to a second inverter 16, which provides a level shifted output signal. The inverter 14 provides an inverted input signal between $V_1$ and ground, while the second inverter provides a level shifted output signal between $V_2$ and $V_3$.

The high voltage level shifter 10 translates a logic level (e.g., logic "0", logic "1") input signal from signals at a low voltage level range to signals at a high voltage level range. For example, a low level high logic input signal provides a voltage $V_2$ at the gate of N2 turning on N2 and pulling node "B" to ground, which causes a high level high logic output signal $V_1$ at the output of the inverter 16. A low level low logic input signal provides a voltage $V_2$ at the gate of N1 turning on N1 and pulling node "A" to ground, which causes P2 to turn on providing a high level low logic output signal at the output of the inverter 16. As the input signal transitions between high and low logic states, the transistors N1 and N2 turn "ON" and "OFF", and the transistors P1 and P2 turn "OFF" and "ON", respectively. The logic level shifter device 10 is designed such that P1 and P2 are substantially weaker devices than N1 and N2, so that the N devices overdrive the P devices preventing the voltage $V_2$ from being shorted to ground.

However, since the P devices are substantially weaker than the N devices, the rise time associated with pulling the nodes "A" and "B" high is substantially slower than the fall time associated with pulling the nodes "A" and "B" low. FIG. 2 illustrates a graph of voltage versus time of various signals associated with the level shifter device 10 of FIG. 1. The input signal $V_{IN1}$ transitions from a logic high to logic low. As the input signal $V_{IN1}$, transitions from a high logic state to a low logic state, the node "B" is pulled to ground very fast with a brief delay associated with providing a logic low at the output $V_{OUT1}$. However, the node "A" takes a substantially longer time to transition from a logic low to a logic high. As the input signal $V_{IN1}$, transitions from a low logic state to a high logic state, the node "A" is pulled to ground very fast with the node "B" taking a substantially longer time to transition from a logic low to a logic high. Therefore, the output is delayed until node "B" rises high enough to trigger the inverter 16.

A circuit can be provided to mitigate the delay associated with the transition of node "B" from logic high to logic low, which monitors for falling edges on the nodes "A" and "B", and outputs the logic state that causes that particular node to fall. This implementation provides a level shifter that is edge triggered rather than level triggered. However, there is a period of time (e.g., 60–100 ns) after a transition in which both nodes are low when one of the internal nodes falls, since the other node is slow to rise. Therefore, the voltage on the rising node is not sufficiently high for the logic to detect a falling edge until the period of time after a transition has expired. This results in a dead time where the circuit cannot respond to another edge transition, or recover in time from the previous transition. A new input signal transition provided before the time period will cause the rising node to be pulled low before the data output transition is detected.

SUMMARY OF INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present invention relates to systems and methods for detecting a state change of a level shifter and actively driving the level shifter into the new state to facilitate the recovery of the level shifter. Circuitry is provided for setting up the level shifter for the next transition. The level shifter is provided with an input signal. The present invention monitors the transition of a high logic to low logic of a first internal node and a second internal node associated with the logic transition of the input signal. The first internal node and the second internal node transition between opposing logic levels, such that one internal node is pulled low and the other internal node is pulled high. The monitor determines when a high to low transition is detected at one of the first node and the second node, and then actively drives the other of the first node and the second node to a logic high. During each transition, the monitor is set up to monitor for an edge transition of a high to low transition of the node that is in a logic high state. Therefore, when the transition does occur the node in the logic low state can be pulled up to a logic high quickly to facilitate the recovery of the level shifter.

The following description and the annexed drawings set forth certain illustrative aspects of the invention. These aspects are indicative, however, of but a few of the various ways in which the principles of the invention may be employed. Other advantages and novel features of the invention will become apparent from the following detailed description of the invention when considered in conjunction with the drawings.

DETAILED DESCRIPTION OF THE INVENTION

The present invention relates to systems and methods for detecting a state change of a level shifter and actively driving the level shifter into the new state to facilitate the recovery of the level shifter. Logic is provided for setting up the level shifter for the next transition. The present invention monitors the transition of a high logic to low logic of a first internal node and a second internal node. The first internal node and the second internal node transition between opposing logic levels, such that one internal node is pulled low and the other internal node is pulled high. The monitor determines when one node is pulled low and actively drives the other node to a logic high when a high to low transition is detected to facilitate the recovery of the level shifter. It is to be appreciated that although the present examples are illustrated with respect to a low to high voltage level shifter devices, the present invention is also applicable to high to low voltage level shifter devices.

Figure 1:
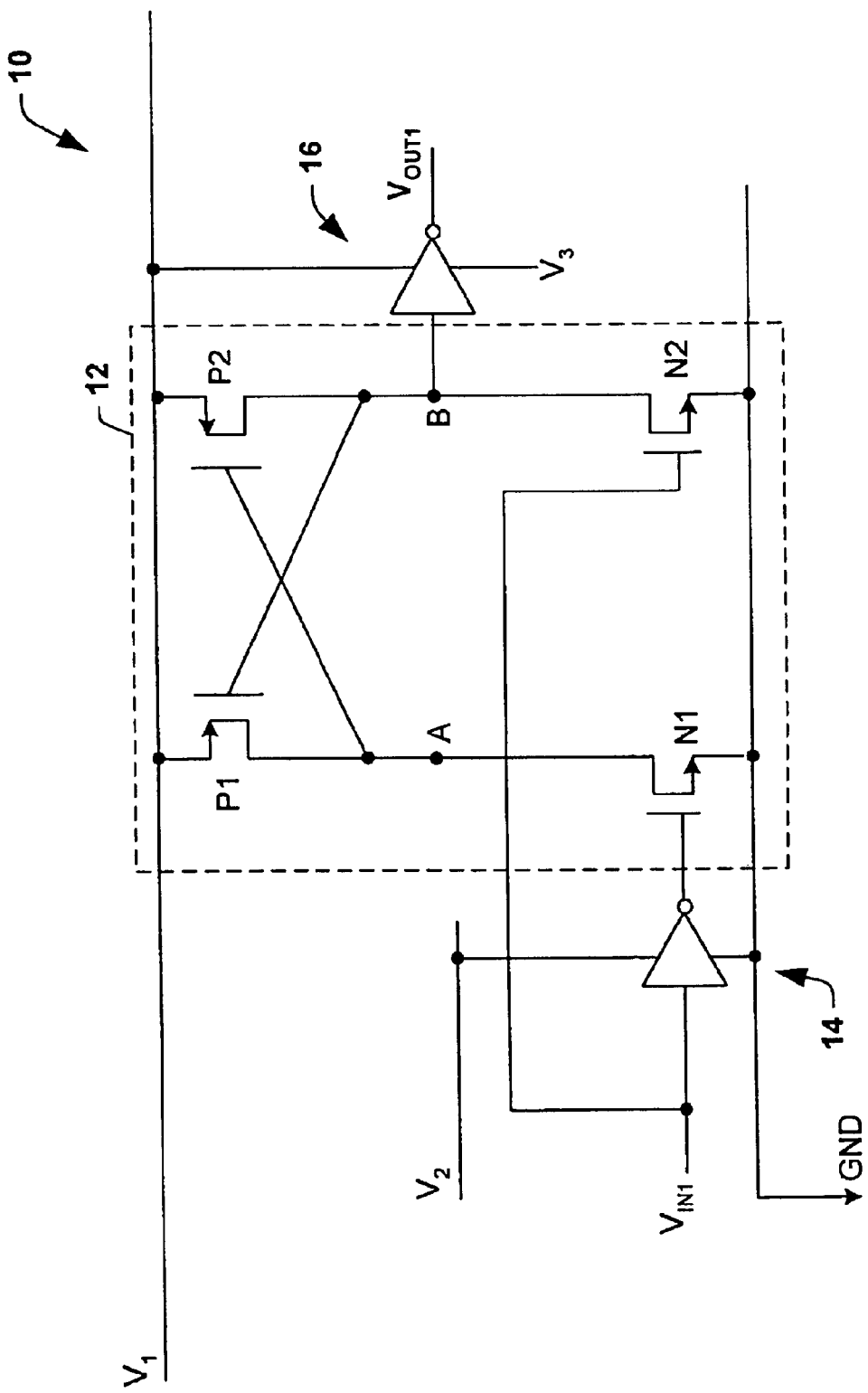
FIG. 1 illustrates a schematic diagram of a prior art level shifter.
Figure 2:
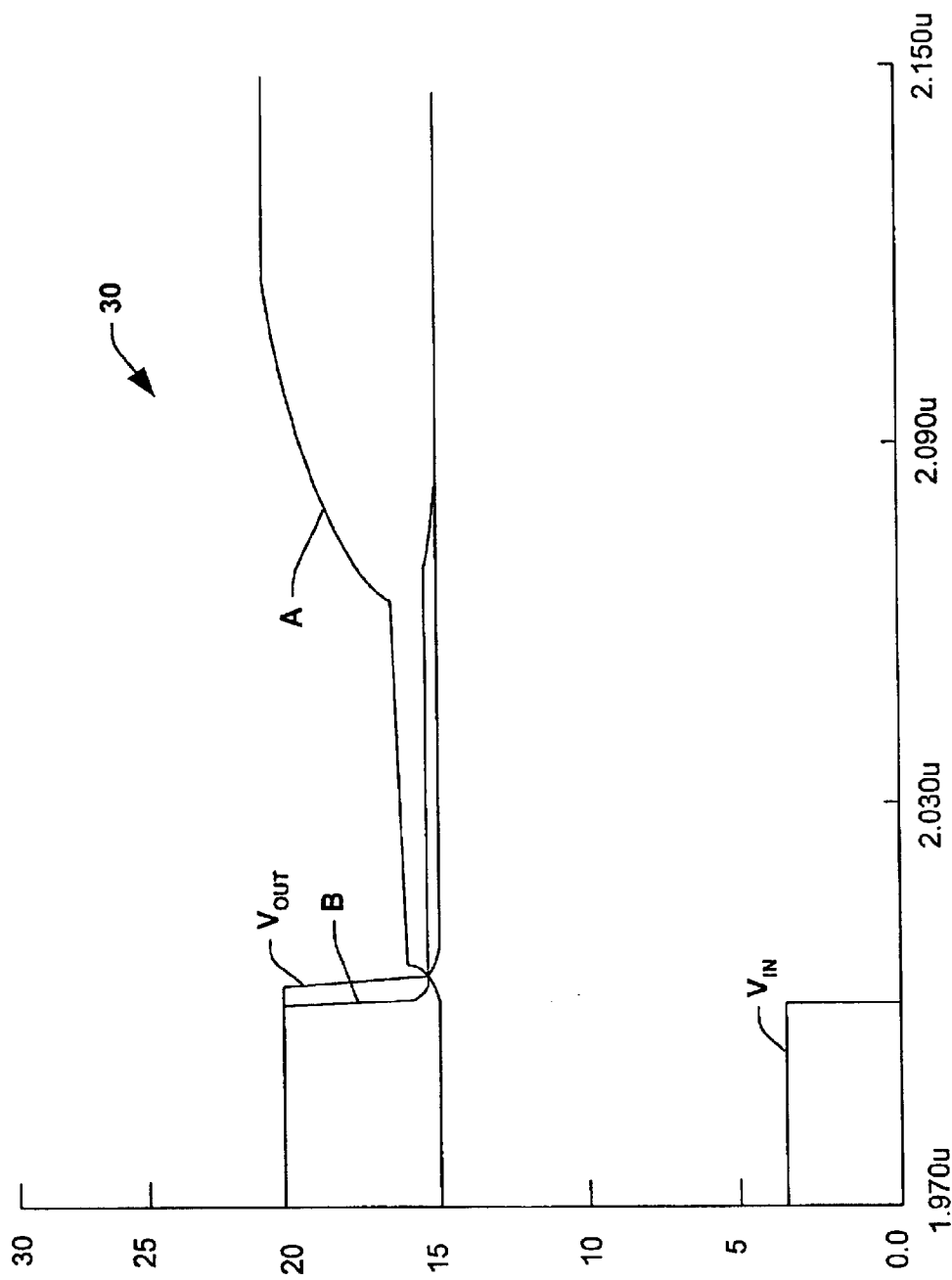
FIG. 2 illustrates a graph of voltage versus time of various signals associated with of the level shifter of FIG. 1.
Figure 3:
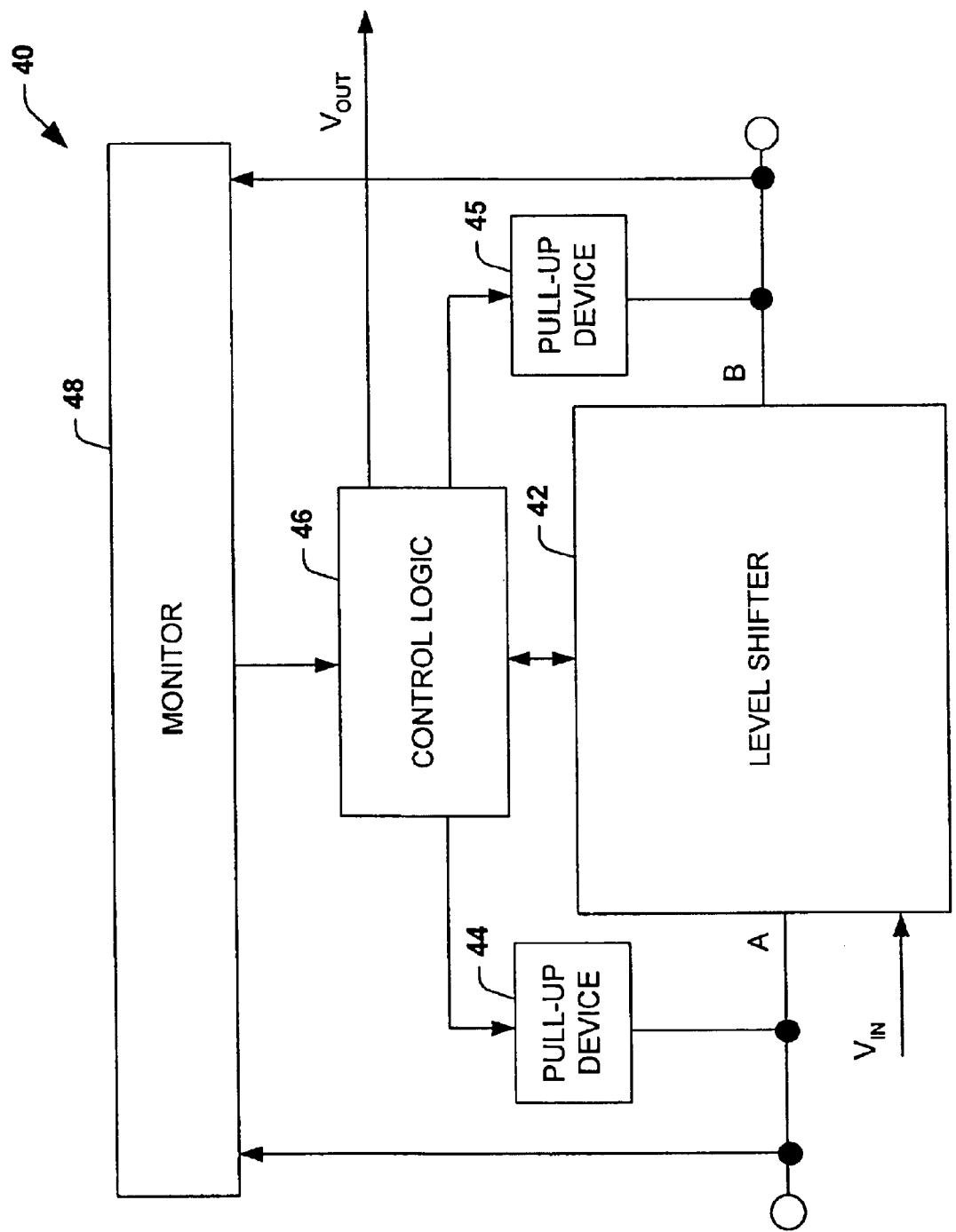
FIG. 3 illustrates a system for facilitating logic level transitions of internal nodes of a level shifter in accordance with an aspect of the present invention.

FIG. 3 illustrates a system 40 for facilitating logic level transitions of internal nodes of a level shifter in accordance with an aspect of the present invention. The system 40 includes a level shifter 42 having a first internal node "A" and a second internal node "B". A monitor device 48 monitors the logic transition from a high logic state to a low logic state of either of the first node "A" and the second node "B". The monitor device 48 includes a power up component that has functionality and/or circuitry that provides recovery of the level shifter when the level shifter is in an undesirable state upon power up. A first pull up device 44 is provided for pulling up the first node "A" when the second node "B" transitions from a logic high state to a logic low state. A second pull up device 45 is provided for pulling up the second node "B" to a logic high when the first node "A" transitions from a logic high state to a logic low state. A control logic device 46 receives signal from the monitor 48 to determine which of the pull up devices 44 and 45 to enable when logic level transitions are detected.

The level shifter 42 receives data input signals at a first voltage level that transition between a logic high level and a logic low level. The transition between the logic high level and the logic low level causes the internal nodes "A" and "B" to transition between opposing logic states. The monitor 48 determines when one of the nodes A and B transition between a logic high and a logic low, and transmits a signal to the control logic device 46. The control logic device 46 provides the logic level output at a second voltage level that corresponds, for example, to the logic level of node "B". The control logic device 48 also pulls up the opposite node associated with the logic high level to the logic low level, so that the transition from a logic low level to a logic high level at the opposite node occurs at substantially the same time as the transition from a logic high level to a logic low level of the pulled down node. Therefore, the transmission rate of the data input signal can be increased without compromising the integrity of the level shifter 42. Once the opposite node is pulled up, the corresponding pull up device is disabled. The control logic device 46 also sets up the node transitioning from a high to low state for the next transition from a low to a high to facilitate an additional increase in the data transmission rate capabilities of the level shifter 42.

For example, when the first node "A" transitions from a logic high level to a logic low level, the control logic device 46 enables the second pull-up device 45 up to the second output voltage level and provides the logic output state corresponding to the input data logic level to the output. The control logic device 46 then sets up for transitioning the node "A" from a logic low level to a logic high level. Once the second node is pulled up, the control logic device 46 disables the second pull-up device 45. When the second node "B" transitions from a logic high level to a logic low level, the control logic device enables the first pull-up device 44 up to the second output voltage level and provides the logic output state corresponding to the input data logic level to the output. The control logic device 46 then sets up for transitioning the node "B" from a logic low level to a logic high level. Once the first node "A" is pulled up, the control logic device 46 disables the first pull-up device 44.

Figure 4:
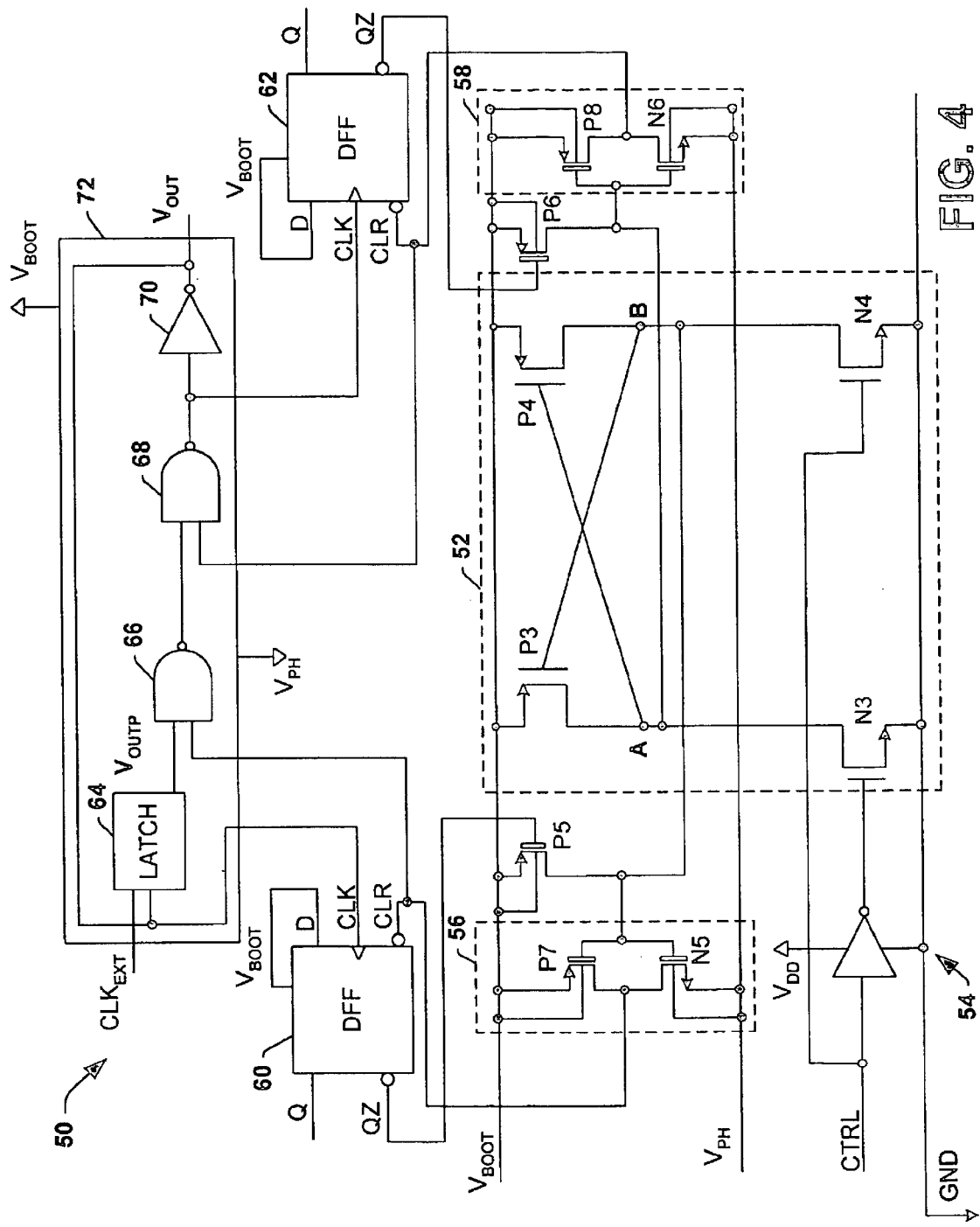
FIG. 4 illustrates a level shifter device in accordance with an aspect of the present invention.

FIG. 4 illustrates a level shifter device 50 for converting an input signal from a low voltage range to a high voltage range in accordance with an aspect of the present invention. The level shifter device 50 includes a level shifting circuit 52. The level shifting circuit 52 includes a first p-type MOSFET device P3 with its drain coupled to the drain of a first n-type MOSFET device N3 through a node "A". A second p-type MOSFET device P4 has its drain coupled to the drain of a second n-type MOSFET device N4 through a node "B". The node "A" is coupled to the gate of the second p-type MOSFET device P4, and the node "B" is coupled to the gate of the first p-type MOSFET device P3. An input signal is received at the gate of the second n-type MOSFET device N4 and at the gate of the first n-type MOSFET device N3 through an inverter 54. The input signal and the inverted input signal toggle between $V_{DD}$ (logic high) and ground (logic low).

The present invention provides for the addition of logic and drivers to speed up the recovery of the level shifter by pulling UP the node "A" and the node "B" to a logic high when a falling edge is detected on the opposite node. Additionally, the logic and drivers allow for data to be switched to the output very rapidly providing the data to the output without going through the whole level shifter. A first pull up switch P5 is coupled between node "B" and $V_{BOOT}$ and is controlled by an inverted output (QZ) of a first D-Flip Flop (DFF) 60. A second pull up switch P6 is coupled between node "A" and $V_{BOOT}$ and is controlled by an inverted output (QZ) of a second DFF 62. The first and second pull up switches P5 and P6 are comprised of very fast strong MOSFET devices. A first inverter 56 comprised of transistor P7 and transistor N5 is coupled to node "B" with its output coupled to the clear line of the first DFF 60. A second inverter 58 comprised of transistor P8 and transistor N6 is coupled to node "A" with its output coupled to the clear line of the second DFF 62. The transistors P7 and P8 are also comprised of very fast strong MOSFET devices.

A control logic device 66 provides clock signals to the first and second DFFs 60 and 62 in addition to providing the output signal $V_{OUT}$ that toggles between $V_{BOOT}$ (logic high) and $V_{PH}$ (logic low). The control logic device 72 includes a latch device 64 that retains the state of the previous output at the last transition. A transition of an external clock $CLK_{EXT}$ clocks the logic state of the previous output $V_{OUTP}$ to a first input of a NAND gate 66. The output from the first inverter 56 is provided as a second input to the NAND gate 66. The output of the NAND gate 66 is provided to a second NAND gate 68 along with the output of the second inverter 58. The output of the second NAND gate 68 provides the clock signal of the second DFF 62. The output of the second NAND gate 68 is also provided to an output inverter 70, which provides the output $V_{OUT}$. The output $V_{OUT}$ also provides the clock signal of the first DFF 60.

During a transition from high to low on node "A", the second inverter 58 provides a high output at the NAND gate 68 and removes the clear from the second DFF 62. The output $V_{OUTP}$ of the latch 64 retains the last state of the output $V_{OUT}$, which corresponds to the state of node "B", which is a logic low at this stage. The output $V_{OUTP}$ is provided to the NAND gate 66 and the inverted state of node "B" is provided to the NAND gate 66, providing a low input to the NAND gate 68. The inverted output of node "A" is also provided to the NAND gate 68. This provides a transition from high to low on the output of the NAND gate 68 and the clock of the second DFF 62, thus, setting the DFF 62 up for the next high to low transition of node "A". Since the output of the NAND gate 68 is low, the output $V_{OUT}$ transitions from low to high. This also clocks the first DFF 60 providing a low output at the inverted output of the DFF 60 turning on the first pull up device P5, which pulls up the node "B" to $V_{BOOT}$ substantially faster than a conventional level shifter. Once node "B" is pulled up to $V_{BOOT}$, the output of the first inverter 56 goes low clearing the DFF 60 and turning off the pull up device P5.

During a transition from high to low on node "B", the first inverter 56 provides a high output at the NAND gate 66 and removes the clear from the first DFF 60. The other input to the NAND gate 66 is high representing the previous output state of the latch 64 $V_{OUTP}$, which provides a low on the input of the NAND gate 68. Since the output of the NAND gate 68 transitions from a low to a high, a transition occurs from low to high on the clock of the second DFF 62 providing a high output at the inverted output of the DFF 62 turning on the second pull up device P6, which pulls up the node "A" to $V_{BOOT}$ substantially faster than a conventional level shifter. Once node "A" is pulled up to $V_{BOOT}$, the output of the second inverter 58 goes low clearing the second DFF 62 and turning off the pull up device P6. The output $V_{OUT}$ also transitions from a high to a low providing a transition from high to low on the clock of the first DFF 60, thus, setting the DFF 60 up for the next high to low transition of node "B". Each transition of node "A" from high to low sets up the second DFF 62 for pulling up node "A" on the next transition of node "B" from high to low. Additionally, each transition of node "B" from high to low sets up the first DFF 60 for pulling up node "B" on the next transition of node "A" from high to low.

Figure 5:
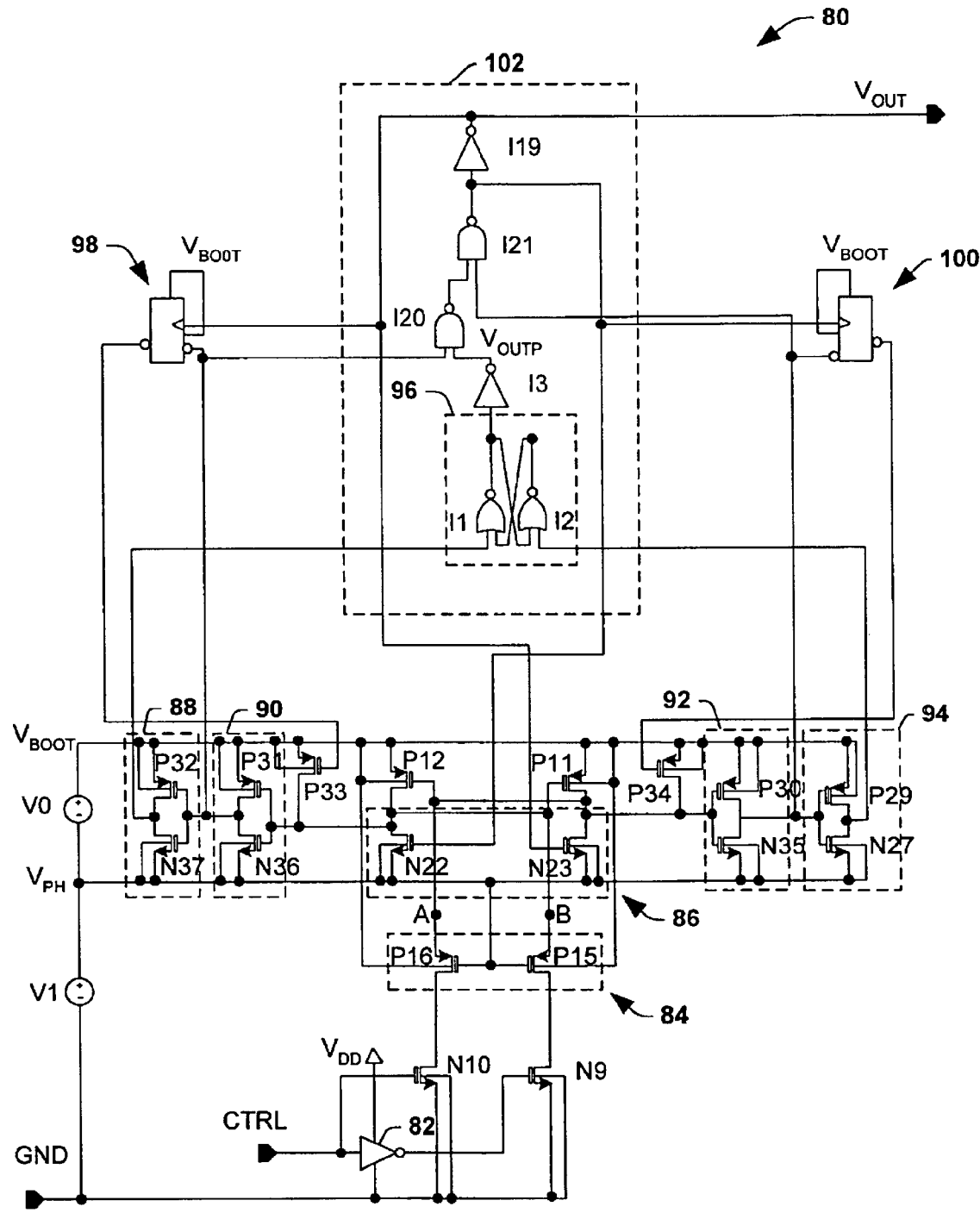
FIG. 5 illustrates an alternate level shifter device in accordance with another aspect of the present invention.

FIG. 5 illustrates an alternate level shifter device 80 that includes components that provide additional speed and control for converting an input signal from a low voltage $V_{PH}$ to a high voltage $V_{BOOT}$ in accordance with an aspect of the present invention. The level shifter device 80 includes a level shifting circuit comprised of a first p-type MOSFET device P12, a first n-type MOSFET device N10, a second p-type MOSFET device P11 and a second n-type MOSFET device N9. A clamping transistor pair 86 and a cascode transistor pair 84 are provided with the level shifting circuit. The clamping transistor pair 86 includes a transistor N22 that clamps the node "B" to VPH and a transistor N23 that clamps the node "A" to VPH when the respective node is in a low state. The cascode pair 84 includes transistors P16 and transistor P15. An input signal (CTRL) is received at the gate of the second n-type MOSFET device N9 and at the gate of the first n-type MOSFET device N10 through an inverter 82. The input signal CTRL and the inverted input signal toggle between a voltage $V_{DD}$ (logic high) and a ground (logic low).

The level shifter device 80 provides for the addition of logic and drivers to speed up the recovery of the level shifter by pulling the node "A" and the node "B" when a falling edge is detected on the opposite node. Additionally, the logic and drivers allows for data to be switched to the output very rapidly providing the data to the output without going through the whole level shifter. Additional logic is provided to facilitate speeding up of the level shifting device 80. A first pull up switch P33 is coupled between node "B" and $V_{BOOT}$ and is controlled by an inverted output (QZ) of a first DFF 98. A second pull up switch P34 is coupled between node "A" and $V_{BOOT}$ and is controlled by an inverted output (QZ) of a second DFF 100. The first and second pull up switches P33 and P34 are comprised of very fast strong MOSFET devices.

A first inverter 90 is comprised of transistor P33 and transistor N36. The first inverter 90 is coupled to node "B" with its output coupled to the clear line of the first DFF 98. A second inverter 92 is comprised of transistor P30 and transistor N35. The second inverter 92 is coupled to node "A" with its output coupled to the clear line of the second DFF 100. The transistors P31 and P30 are also comprised of very fast strong MOSFET devices.

A control logic device 102 provides clock signals to the first and second DFFs 98 and 100 in addition to providing the output signal $V_{OUT}$ that toggles between $V_{BOOT}$ (logic high) and $V_{PH}$ (logic low). The control logic device 102 includes a RS latch device 96 that retains the state of the previous output at the last transition. The RS latch device 96 includes a first NOR gate I1 and a second NOR gate I2. A third inverter 88 is comprised of P32 and N37 and is coupled to the first inverter 90 with its output provided to the first NOR gate I1 of the RS latch 96. A fourth inverter 94 is comprised of P29 and N27 and is coupled to the second inverter 92 with its output provided to the second NOR gate I2 of the RS latch 96. The output of the RS latch 96 is coupled to an inverter I3. The inverter I3 includes an output $V_{OUTP}$. The previous output $V_{OUTP}$ is provided to a NAND gate I20 along with the output from the first inverter 90. The output of the NAND gate I20 is provided to a second NAND gate I21 along with the output of the second inverter 92. The output of the second NAND gate I21 provides the clock signal of the second DFF 100. The output of the second NAND gate I21 is also provided to an output inverter I19, which provides the output $V_{OUT}$. The output $V_{OUT}$ also provides the clock signal of the first DFF 98.

During a transition from high to low on node "A", the second inverter 92 provides a high output at the NAND gate I21 and removes the clear from the second DFF 98. The RS latch 96 and inverter I3 provide the output $V_{OUTP}$ which corresponds to the last state of the output $V_{OUT}$, which is also the state of node "B", which is a logic low at this stage. The output $V_{OUTP}$ is provided to the NAND gate I20 and the inverted state of node "B", which is low, is provided to the NAND gate I21, providing a low output at the NAND gate I21. This provides a transition from high to low on the clock of the second DFF 100, thus, setting the DFF 62 up for the next high to low transition of node "A". Since the output of the NAND gate I21 is low, the output $V_{OUT}$ transitions from low to high. This also clocks the first DFF 98 providing a low output at the inverted output of the DFF 98 turning on the first pull up device P33, which pulls up the node "B" to $V_{BOOT}$ substantially faster than a conventional level shifter.

Once node "B" is pulled up to $V_{BOOT}$, the output of the first inverter 90 goes low clearing the first DFF 98 and turning off the pull up device P33.

During a transition from high to low on node "B", the first inverter 92 provides a high output at the NAND gate I20 and removes the clear from the first DFF 98. The other input to the NAND gate I20 is high representing the previous output state $V_{OUTP}$ of the RS latch 96 and the inverter I3. This provides a low on the input of the NAND gate I21. Since the output of the NAND gate I21 transitions from a low to a high, a transition occurs from low to high on the clock of the second DFF 100 providing a high output at the inverted output of the DFF 100 turning on the second pull up device P34, which pulls up the node "A" to $V_{BOOT}$ substantially faster than a conventional level shifter. Once node "A" is pulled up to $V_{BOOT}$, the output of the second inverter 92 clears the second DFF 100 turning off the pull up device P34. The output $V_{OUT}$ also transitions from a high to a low providing a transition from high to low on the clock of the first DFF 98, thus, setting the DFF 98 up for the next high to low transition of node "B". Each transition of node "A" from high to low sets up the second DFF 100 for pulling up node "A" on the next transition of node "B" from high to low. Additionally, each transition of node "B" from high to low sets up the first DFF 98 for pulling up node "B" on the next transition of node "A" from high to low.

Figure 6:
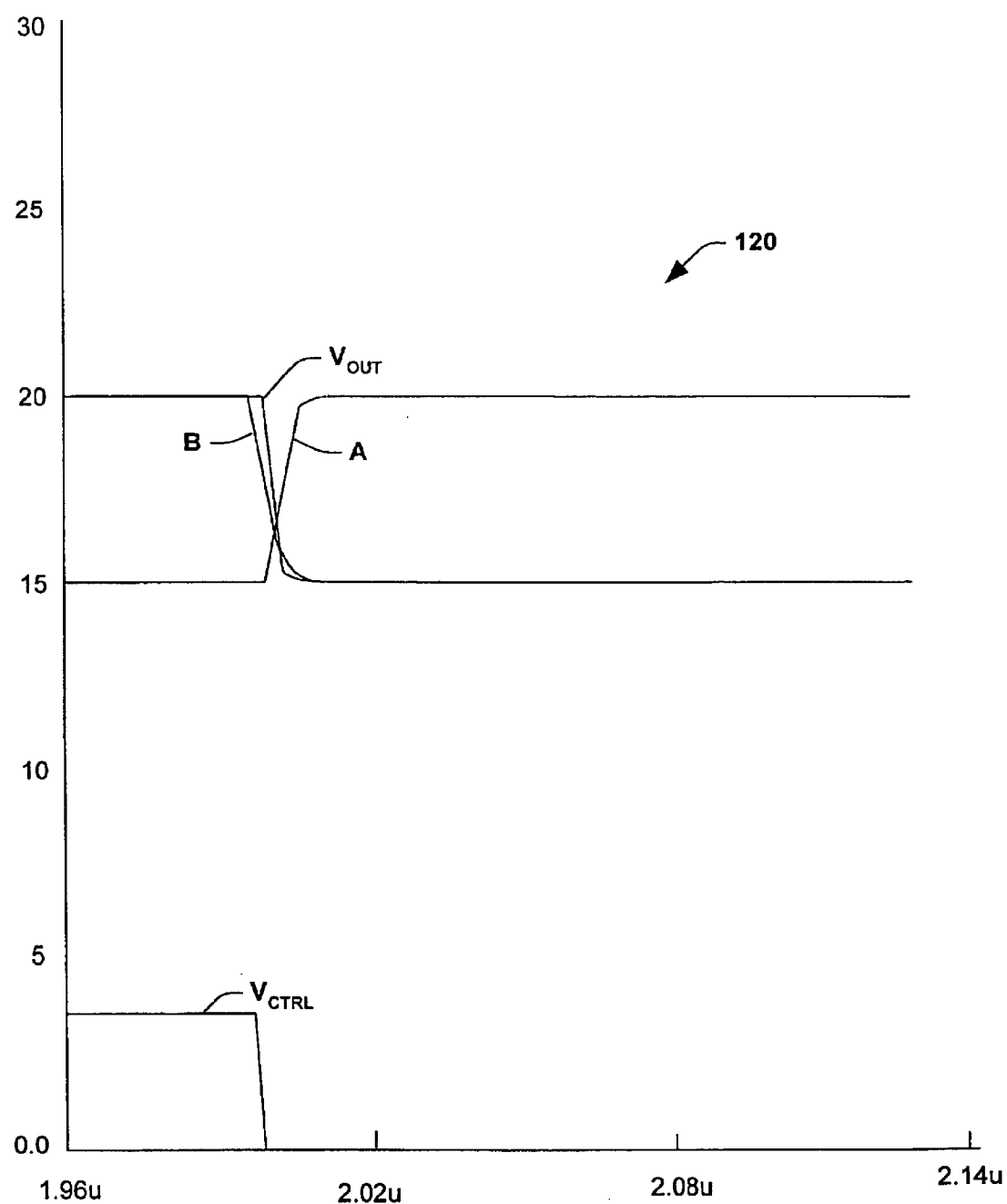
FIG. 6 illustrates a graph of voltage versus time of various signals associated with the level shifter device of FIGS. 4–5.

FIG. 6 illustrates a graph 120 of voltage versus time of various signals of a level shifting system as illustrated in FIGS. 4–5 in accordance with the present invention. The time range is illustrated as being from 1.96 uS to 2.14 uS. The input logic levels transition between 0.0 volts (logic low) and 3.3 volts (logic high), while the internal nodes A and B, and the output voltage transition between 15 volts (logic low) and 20 volts (logic high). As illustrated in the graph 120, the input voltage $V_{CTRL}$ transitions between a logic high and a logic low. The node "B" is pulled down to a logic low quickly by strong n-type transistors, while the output $V_{OUT}$ corresponding to the logic state of the input signal (logic low) level shifted to the high voltage ranges is also provided very quickly. The pulling down of the node "B" causes the pull up device of node "A" to be enabled pulling up the node "A" to a high logic level at the second voltage range very quickly which is then released so that the node "A" is not pulled up above the logic high level of 20 volts. Due to the pull up device, the monitor and control logic, the node "A" is pulled up at substantially the same time interval as the node "B" is pulled down. Therefore, the input signal data rate can be increased relative to a conventional level shifter. A similar result is provided when node "B" transitions from a high logic to a low logic, such that node "A" will be pulled up relatively quickly by the pull up device associated with node "A".

Figure 7:
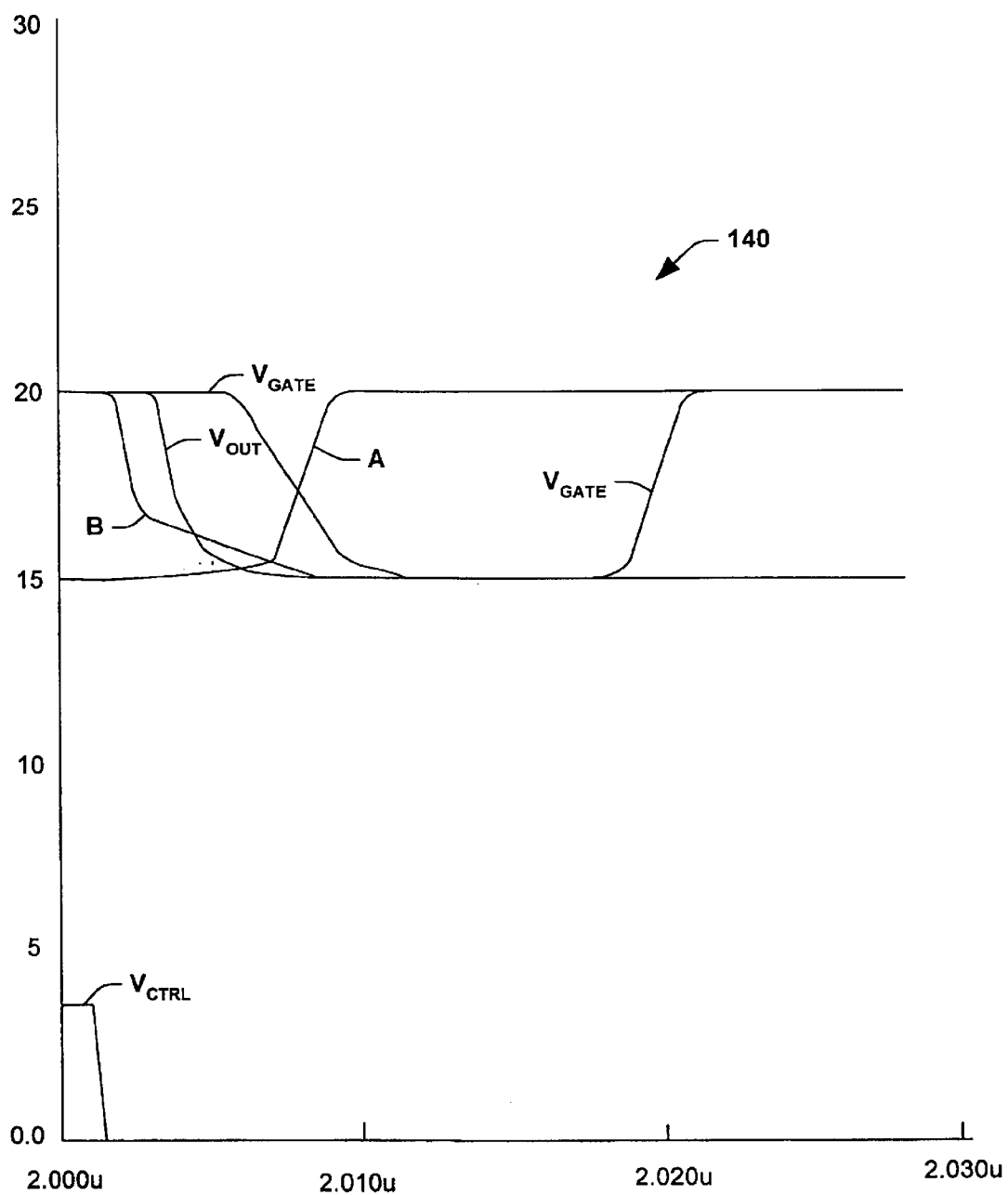
FIG. 7 illustrates a graph of voltage versus time of various signals including the gate voltage of a pull up device associated with the level shifter device of FIGS. 4–5.

FIG. 7 illustrates an alternate graph 140 of voltage versus time of various signals of a level shifting system as illustrated in FIGS. 4–5 in accordance with the present invention. The time range is illustrated as being from 2.000 uS to 2.030 uS. The input logic levels transition between 0.0 volts (logic low) and 3.3 volts (logic high), while the internal nodes A and B, the gate voltage $V_{GATE}$ of the pull up device associated with node "A", and the output voltage $V_{OUT}$ transition between 15 volts (logic low) and 20 volts (logic high). As illustrated in the graph 140, the input voltage $V_{CTRL}$ transitions between a logic high and a logic low. The node "B" is pulled down to a logic low quickly by strong n-type transistors, while the output $V_{OUT}$ corresponding to the logic state of the input signal (logic low) level shifted to the high voltage ranges, which is also provided very quickly. The pulling down of the node "B" causes the pull up device of node "A" to be enabled, so that $V_{GATE}$ of the pull up device associated with node "A" begins transitioning down to a logic low pulling up the node "A" to a high logic level at the second voltage range very quickly. Once the logic level of node "A" is pulled up, the pull up device gate voltage $V_{GATE}$ returns to a logic high so that the node "A" is not pulled up above the logic high level of 20 volts.

Figure 8:
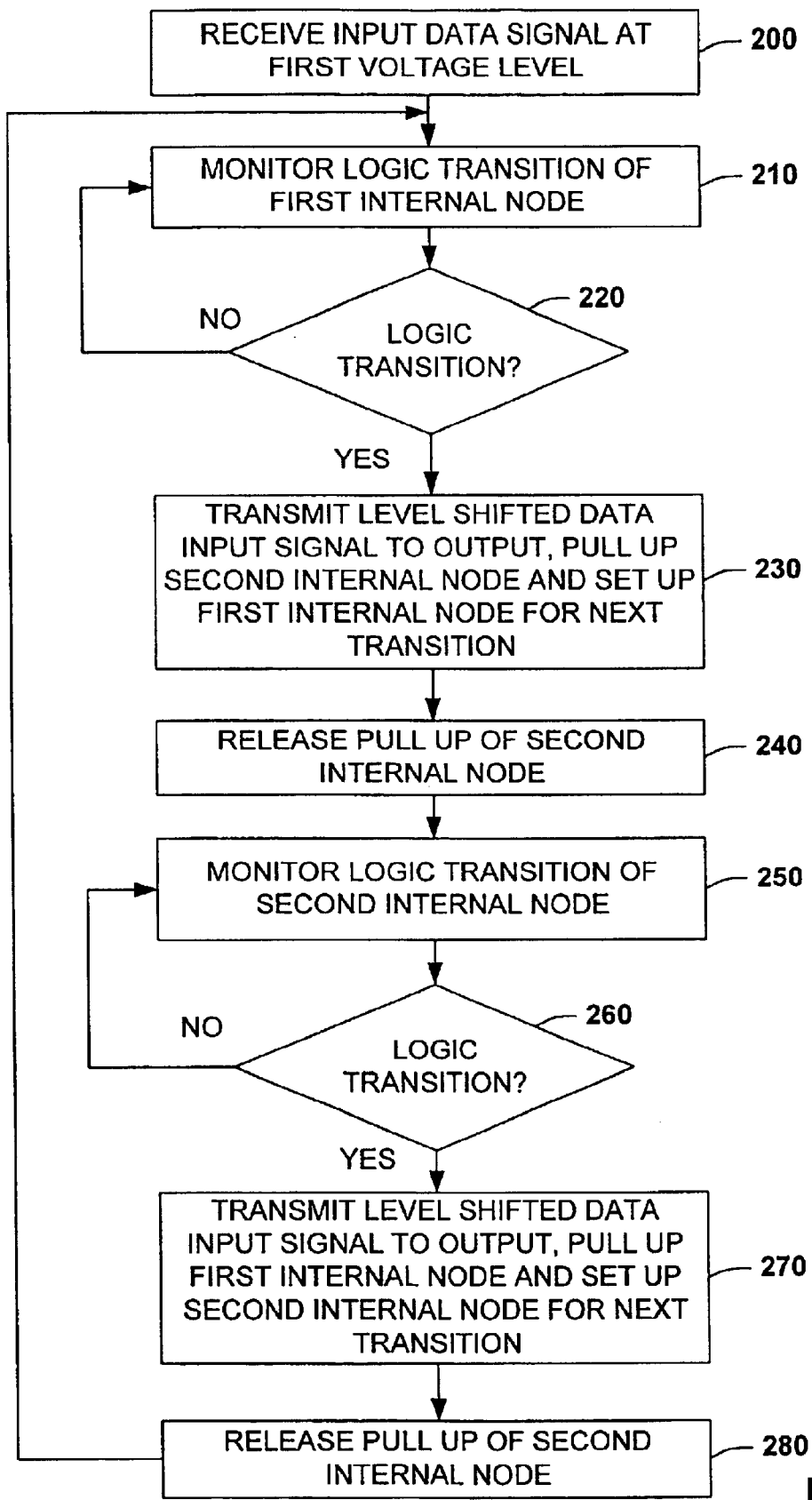
FIG. 8 illustrates a flow diagram of a methodology for facilitating the transition of logic levels of internal nodes of a level shifter in accordance with an aspect of the present invention.

In view of the foregoing structural and functional features described above, a methodology in accordance with various aspects of the present invention will be better appreciated with reference to FIG. 8. While, for purposes of simplicity of explanation, the methodology of FIG. 8 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect the present invention.

FIG. 8 illustrates one particular methodology for facilitating the transition of logic levels of internal nodes of a level shifter in accordance with an aspect of the present invention. The methodology begins at 200 where the level shifter begins receiving a data input signal at a first voltage level. At 210, the methodology begins monitoring logic transitions corresponding to logic transitions of the input data signal at a first internal node. The logic transition is from a high logic to a low logic. At 220, the methodology determines if a logic transition has occurred at the first internal node. If a logic transition has not occurred at the first internal node (NO), the methodology returns to 210 to continue monitoring the first internal node for a logic transition. If a logic transition has occurred at the first internal node (YES), the methodology proceeds to 230. At 230, the data input signal logic level is level shifted and provided to the output at a second voltage level. Additionally, the second internal node is pulled up to a level shifted logic high level and the first internal node is set up to be pulled up quickly to a logic high in the next data logic transition. At 240, the pull up of the second internal node is released once the second internal node has reached a logic high level. The methodology then advances to 250.

At 250, the methodology begins monitoring logic transitions corresponding to logic transitions of the input data signal at the second internal node. The logic transition is from a high logic to a low logic. At 260, the methodology determines if a logic transition has occurred at the second internal node. If a logic transition has not occurred at the second node (NO), the methodology returns to 250 to continue monitoring the second internal node for a logic transition. If a logic transition has occurred at the second internal node (YES), the methodology proceeds to 270. At 270, the data input signal logic level is level shifted and provided to the output at a second voltage level. Additionally, the first internal node is pulled up to a level shifted logic high level and the second internal node is set up to be pulled up quickly to a logic high in the next data logic transition. At 280, the pull up of the first internal node is released once the first internal node has reached a logic high level. The methodology then returns to 210 to monitor a logic transition of the first internal node.

What has been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A system for facilitating logic level transitions of internal nodes of a level shifter, the system comprising:

a level shifter having a first internal node and a second internal node;

a monitor that monitors logic transitions of the first internal node and the second internal node associated with logic transitions of an input signal to the level shifter at a first voltage level range, the first internal node and the second internal node transitioning between opposing logic states at a second voltage level range based on a logic state of the input signal to provide a level shifted output signal at the second voltage level range having logic transitions corresponding to the logic transitions of the input signal;

a first pull up device that pulls up the first internal node when the monitor detects a high to low edge transition on the second internal node;

a second pull up device that pulls up the second internal node when the monitor detects a high to low edge transition on the first internal node;

a control logic device that enables and disables the first pull up device and the second pull up device based on signals received from the monitor; and the control logic device and monitor comprising a first flip-flop coupled to the first pull up device, a second flip flop coupled to the second pull up device and a plurality of logic gates.

2. A system for facilitating logic level transitions of internal nodes of a level shifter, the system comprising:

a level shifter having a first internal node and a second internal node;

a monitor that monitors logic transitions of the first internal node and the second internal node associated with logic transitions of an input signal to the level shifter at a first voltage level range, the first internal node and the second internal node transitioning between opposing logic states at a second voltage level range based on a logic state of the input signal to provide a level shifted output signal at the second voltage level range having logic transitions corresponding to the logic transitions of the input signal;

a first pull up device that pulls up the first internal node when the monitor detects a high to low edge transition on the second internal node;

a second pull up device that pulls up the second internal node when the monitor detects a high to low edge transition on the first internal node; and the monitor comprising a power up component that provides recovery of the level shifter when the level shifter is in an undesirable state upon power up.

3. A level shifting device comprising:

a level shifting circuit operative to receive an input signal having logic levels at a first voltage range and transition a first internal node and a second internal node between opposing logic levels at a second voltage range to provide an output signal at the second voltage range corresponding to the logic levels of the input signal;

a first pull up transistor that pulls up the second internal node to a logic high state when a high to low edge transition on the first internal node is detected; a second pull up transistor that pulls up the first internal node to a logic high state when a high to low edge transition on the second internal node is detected; and a first flip flop that enables the first pull up transistor when a high to low edge transition on the first internal node is detected and a second flip flop that enables the second pull up transistor when a high to low edge transition on the second internal node is detected.

4. The level shifting device of claim 3, the first inverter sets up the first flip flop for enabling the first pull up transistor in the next transition from a low to high on the second internal node when a high to low on the second internal node is detected, and the second inverter sets up the second flip flop for enabling the second pull up transistor in the next transition from a high to low on the first internal node when a high to low on the first internal node is detected.

5. The level shifting device of claim 3, further comprising a logic device that receives a logic transition state from a low to high from the first inverter and provides a clock signal to the second flip flop that enables the second pull up transistor, and receives a logic transition state from a low to high from the second inverter and provides a clock signal to the first flip flop that enables the first pull up transistor.

6. The level shifting device of claim 5, the logic device provides an output signal at the higher voltage range having a logic based on the state of at least one of the first inverter and the second inverter.

7. A level shifting device comprising:

a level shifting circuit operative to receive an input signal having logic levels at a first voltage range and transition a first internal node and a second internal node between opposing logic levels at a second voltage range to provide an output signal at the second voltage range corresponding to the logic levels of the input signal;

a first pull up transistor that pulls up the second internal node to a logic high state when a high to low edge transition on the first internal node is detected;

a second pull up transistor that pulls up the first internal node to a logic high state when a high to low edge transition on the second internal node is detected;

a first inverter comprised of a first and a second transistor device and a second inverter comprised of a first and a second transistor device, the first inverter coupled to the second internal node and the first pull up transistor, the second inverter coupled to the first internal node and the second pull up transistor; and a third inverter coupled to the first inverter and a fourth inverter coupled to the second inverter, the third inverter and the fourth inverter coupled to a latch device to provide a previous output logic state to a logic device, the logic device provides control signals for enabling the first pull up transistor and the second pull up transistor.

8. A level shifting device comprising:

a level shifting circuit operative to receive an input signal having logic levels at a first voltage range and transition a first internal node and a second internal node between opposing logic levels at a second voltage range to provide an output signal at the second voltage range corresponding to the logic levels of the input signal;

a first pull up transistor that pulls up the second internal node to a logic high state when a high to low edge transition on the first internal node is detected;

a second pull up transistor that pulls up the first internal node to a logic high state when a high to low edge transition on the second internal node is detected;

a first inverter comprised of a first and a second transistor device and a second inverter comprised of a first and a second transistor device, the first inverter coupled to the second internal node and the first pull up transistor, the second inverter coupled to the first internal node and the second pull up transistor; and clamping transistors operative to clamp the first internal node and the second internal node to a logic low at the higher voltage level.

* * * * *